(12) United States Patent
Parsche

(10) Patent No.: US 9,004,171 B2
(45) Date of Patent: Apr. 14, 2015

(54) SYSTEM FOR HEATING A HYDROCARBON RESOURCE IN A SUBTERRANEAN FORMATION INCLUDING A MAGNETIC AMPLIFIER AND RELATED METHODS

(75) Inventor: Francis Parsche, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 383 days.

(21) Appl. No.: 13/456,857

(22) Filed: Apr. 26, 2012

(65) Prior Publication Data

US 2013/0284430 A1   Oct. 31, 2013

(51) Int. Cl.
*E21B 36/04* (2006.01)
*E21B 43/24* (2006.01)
*H03F 9/00* (2006.01)

(52) U.S. Cl.
CPC .............. *H03F 9/00* (2013.01); *E21B 43/2401* (2013.01)

(58) Field of Classification Search
CPC .. E21B 36/04; E21B 43/2401; H05B 2214/03
USPC ............................................. 166/302, 57, 60
See application file for complete search history.

(56) References Cited

U.S. PATENT DOCUMENTS

| | | | |
|---|---|---|---|
| 2,915,723 A | 12/1959 | Wennerberg | |
| 2,929,034 A | 3/1960 | Doherty | |
| 2,930,983 A | 3/1960 | Fein | |
| 3,170,519 A * | 2/1965 | Haagensen | 166/60 |
| 5,066,904 A | 11/1991 | Bullock | |
| 6,239,668 B1 | 5/2001 | Menna et al. | |
| 6,246,299 B1 | 6/2001 | Werlau | |
| 7,091,460 B2 | 8/2006 | Kinzer | |
| 7,109,457 B2 | 9/2006 | Kinzer | |
| 7,115,847 B2 | 10/2006 | Kinzer | |
| 7,312,428 B2 | 12/2007 | Kinzer | |
| 7,362,235 B1 | 4/2008 | Normann et al. | |
| 7,441,597 B2 | 10/2008 | Kasevich | |
| 7,889,026 B2 | 2/2011 | Parsche et al. | |
| 7,940,151 B2 | 5/2011 | Parsche et al. | |
| 8,726,986 B2 | 5/2014 | Parsche | |
| 2007/0187089 A1 | 8/2007 | Bridges | |
| 2010/0078163 A1 | 4/2010 | Banerjee et al. | |
| 2010/0219107 A1 | 9/2010 | Parsche | |
| 2010/0294488 A1 | 11/2010 | Wheeler et al. | |
| 2010/0294489 A1 | 11/2010 | Dreher, Jr. et al. | |
| 2011/0309990 A1 | 12/2011 | Parsche | |
| 2012/0006444 A1 | 1/2012 | Tupper et al. | |
| 2012/0073798 A1 | 3/2012 | Parsche et al. | |
| 2013/0192825 A1 | 8/2013 | PARSCHE | |
| 2014/0110104 A1 | 4/2014 | PARSCHE | |

FOREIGN PATENT DOCUMENTS

WO          9215770          9/1992

OTHER PUBLICATIONS

U.S. Appl. No. 13/456,797, filed Apr. 26, 2012.

\* cited by examiner

*Primary Examiner* — Robert E Fuller
(74) *Attorney, Agent, or Firm* — Allen, Dyer, Doppelt, Milbrath & Gilchrist, P.A.

(57) ABSTRACT

A system for heating a hydrocarbon resource in a subterranean formation having a wellbore extending therein may include a radio frequency (RF) source, an RF antenna to be positioned within the wellbore, and a magnetic amplifier to be positioned in the wellbore and configured to couple the RF source to the RF antenna so that the RF antenna supplies RF power to the hydrocarbon resource in the subterranean formation.

11 Claims, 9 Drawing Sheets

SYSTEM FOR HEATING A HYDROCARBON RESOURCE IN A SUBTERRANEAN FORMATION INCLUDING A MAGNETIC AMPLIFIER AND RELATED METHODS

FIELD OF THE INVENTION

The present invention relates to the field of hydrocarbon resource recovery, and, more particularly, to hydrocarbon resource recovery using radio frequency RF heating.

BACKGROUND OF THE INVENTION

Energy consumption worldwide is generally increasing, and conventional hydrocarbon resources are being consumed. In an attempt to meet demand, the exploitation of unconventional resources may be desired. For example, highly viscous hydrocarbon resources, such as heavy oils, may be trapped in tar sands where their viscous nature does not permit conventional oil well production. Estimates are that trillions of barrels of oil reserves may be found in such tar sand formations.

In some instances these tar sand deposits are currently extracted via open-pit mining. Another approach for in situ extraction for deeper deposits is known as Steam-Assisted Gravity Drainage (SAGD). The heavy oil is immobile at reservoir temperatures and therefore the oil is typically heated to reduce its viscosity and mobilize the oil flow. In SAGD, pairs of injector and producer wells are formed to be laterally extending in the ground. Each pair of injector/producer wells includes a lower producer well and an upper injector well. The injector/production wells are typically located in the payzone of the subterranean formation between an underburden layer and an overburden layer.

The upper injector well is used to typically inject steam, and the lower producer well collects the heated crude oil or bitumen that flows out of the formation, along with any water from the condensation of injected steam. The injected steam forms a steam chamber that expands vertically and horizontally in the formation. The heat from the steam reduces the viscosity of the heavy crude oil or bitumen which allows it to flow down into the lower producer well where it is collected and recovered. The steam and gases rise due to their lower density so that steam is not produced at the lower producer well and steam trap control is used to the same affect. Gases, such as methane, carbon dioxide, and hydrogen sulfide, for example, may tend to rise in the steam chamber and fill the void space left by the oil defining an insulating layer above the steam. Oil and water flow is by gravity driven drainage, into the lower producer well.

Operating the injection and production wells at approximately reservoir pressure may address the instability problems that adversely affect high-pressure steam processes. SAGD may produce a smooth, even production that can be as high as 70% to 80% of the original oil in place (OOIP) in suitable reservoirs. The SAGD process may be relatively sensitive to shale streaks and other vertical barriers since, as the rock is heated, differential thermal expansion causes fractures in it, allowing steam and fluids to flow through. SAGD may be twice as efficient as the older cyclic steam stimulation (CSS) process.

RF heating is an alternative to steam enhanced oil recovery technology. It provides increased speed and penetration relative steam, can penetrate and break underground rock layers, and also may upgrade or improve the oil. Increased speed means increased present value financially. RF heating energies can be one or more of: electric fields, magnetic fields, or electric currents, all of these energies have heating effects in hydrocarbon formations.

Many countries in the world have large deposits of oil sands, including the United States, Russia, and various countries in the Middle East. Oil sands may represent as much as two-thirds of the world's total petroleum resource, with at least 1.7 trillion barrels in the Canadian Athabasca Oil Sands, for example. At the present time, only Canada has a large-scale commercial oil sands industry, though a small amount of oil from oil sands is also produced in Venezuela. Because of increasing oil sands production, Canada has become the largest single supplier of oil and products to the United States. Oil sands now are the source of almost half of Canada's oil production, although due to the 2008 economic downturn work on new projects has been deferred, while Venezuelan production has been declining in recent years. Oil is not yet produced from oil sands on a significant level in other countries.

U.S. Published Patent Application No. 2010/0078163 to Banerjee et al. discloses a hydrocarbon recovery process whereby three wells are provided, namely an uppermost well used to inject water, a middle well used to introduce microwaves into the reservoir, and a lowermost well for production. A microwave generator generates microwaves which are directed into a zone above the middle well through a series of waveguides. The frequency of the microwaves is at a frequency substantially equivalent to the resonant frequency of the water so that the water is heated.

Along these lines, U.S. Published Application No 2010/0294489 to Dreher, Jr. et al. discloses using microwaves to provide heating. An activator is injected below the surface and is heated by the microwaves, and the activator then heats the heavy oil in the production well. U.S. Published Application No 2010/0294488 to Wheeler et al. discloses a similar approach.

U.S. Pat. No. 7,441,597 to Kasevich discloses using a radio frequency generator to apply RF energy to a horizontal portion of an RF well positioned above a horizontal portion of a oil/gas producing well. The viscosity of the oil is reduced as a result of the RF energy, which causes the oil to drain due to gravity. The oil is recovered through the oil/gas producing well.

Unfortunately, long production times, for example, due to a failed start-up, to extract oil using SAGD may lead to significant heat loss to the adjacent soil, excessive consumption of steam, and a high cost for recovery. Significant water resources are also typically used to recover oil using SAGD, which impacts the environment. Limited water resources may also limit oil recovery. SAGD is also not an available process in permafrost regions, for example.

Moreover, despite the existence of systems that utilize RF energy to provide heating, such systems may suffer from inefficiencies as a result of mismatches between the RF source, transmission line, and/or antenna. These mismatches become particularly acute with increased heating of the subterranean formation.

SUMMARY OF THE INVENTION

It is therefore an object of the invention to provide enhanced operating characteristics for hydrocarbon resource recovery systems and related methods.

These and other objects, features, and advantages are provided by a system for heating a hydrocarbon resource in a subterranean formation having a wellbore extending therein. The system includes a radio frequency (RF) source, an RF antenna to be positioned within the wellbore, and a magnetic amplifier to be positioned in the wellbore and configured to couple the RF source to the RF antenna so that the RF antenna supplies RF power to the hydrocarbon resource in the subterranean formation. The magnetic amplifier may advantageously provide desired signal adjustment as the operating characteristics of the RF antenna change during the heating process, such as amplification, impedance matching, waveform shaping, or harmonic multiplication.

More particularly, the magnetic amplifier may include a core, a shield assembly surrounding the core, and an electromagnet surrounding the shield assembly. Furthermore, the core may include an elongate inner conductor, and a magnetic medium surrounding the elongate inner conductor. By way of example, the magnetic medium may comprise a ferrite. Additionally, the shield assembly may include inner and outer concentric conductors, and a stub conductor therebetween. At least one tuning plunger may be associated with the shield assembly.

Further, the electromagnet may include a conductive winding surrounding the shield assembly, and an electromagnetic core surrounding the conductive winding. In addition, the inner conductor and the shield assembly may be coaxial. Also, the inner conductor may comprise a helical conductor. The system may further include a variable direct current (DC) source coupled to the conductive winding. Additionally, a transmission line may be coupled between the RF source and the transformer.

A magnetic amplifier, such as the one described briefly above, and a related method for heating a hydrocarbon resource in a subterranean formation are also provided. The method includes coupling a magnetic amplifier to a radio frequency (RF) antenna, and positioning the magnetic amplifier and RF antenna within the wellbore so that the RF antenna is adjacent the hydrocarbon resource. The method further includes coupling the magnetic amplifier to an RF source, and operating the RF source and the magnetic amplifier so that the RF antenna supplies RF power to the hydrocarbon resource in the subterranean formation.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

Figure 1:
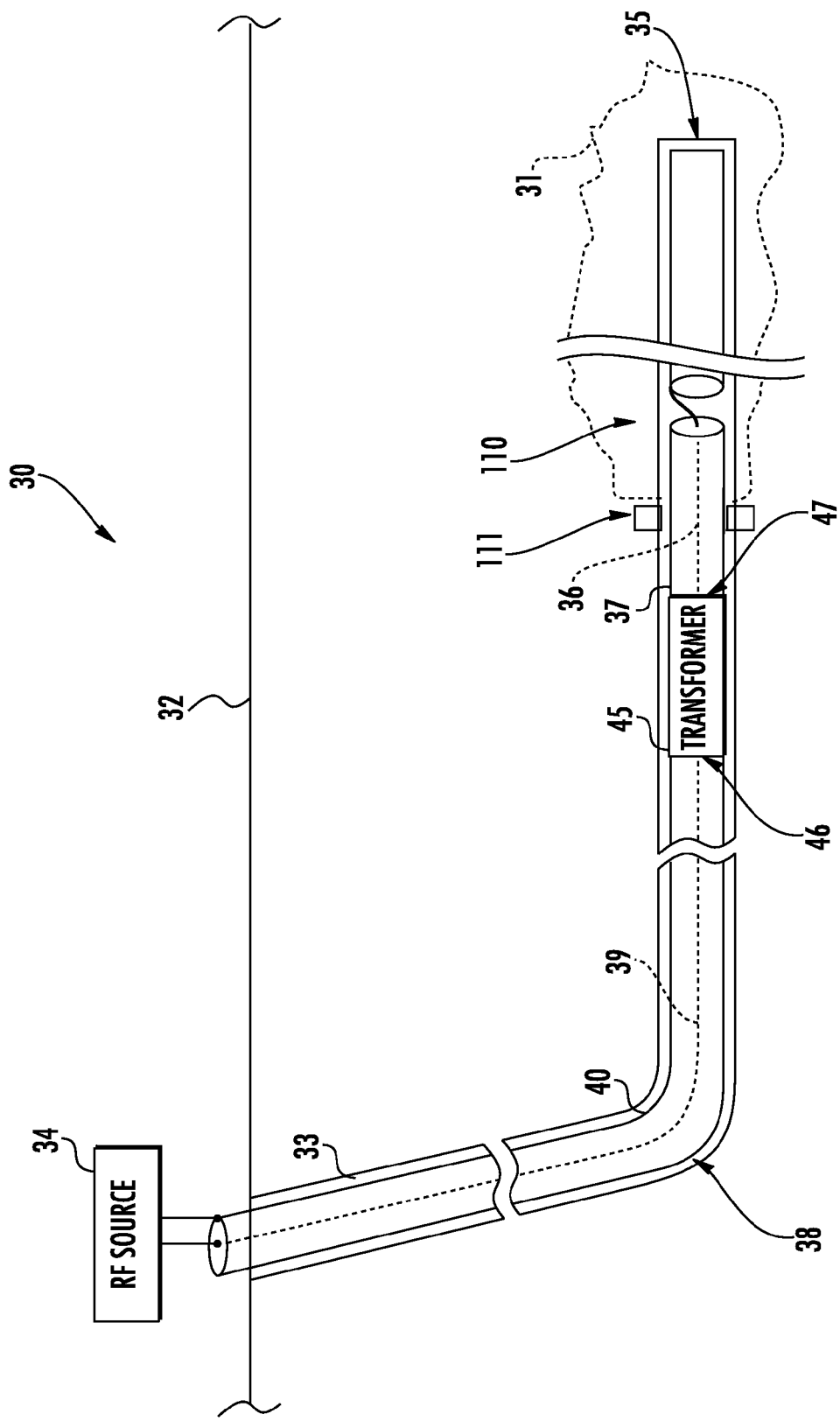
FIG. 1 is a schematic block diagram of a system for heating a hydrocarbon resource in accordance with the present invention.

Referring initially to FIG. 1, a system 30 for heating a hydrocarbon resource 31 (e.g., oil sands, etc.) in a subterranean formation 32 having a wellbore 33 therein is first described. In the illustrated example, the wellbore 33 is a laterally extending wellbore, although the system 30 may be used with vertical or other wellbores in different configurations. The system 30 further illustratively includes a radio frequency (RF) source 34 for an RF antenna 35 that is illustratively positioned in the wellbore 33 adjacent the hydrocarbon resource 31. The RF source 34 is positioned above the subterranean formation 32, and may be an RF power generator, for example. In an exemplary implementation, the laterally extending wellbore 33 may extend about 1,000 meters in length within the subterranean formation 32, and about 240 meters underground, although other depths and lengths may be used in different implementations.

Although not shown, in some embodiments a second wellbore may be used below the wellbore 33, such as in a SAGD implementation, for collection of petroleum, etc., released from the subterranean formation 32 through heating. The second wellbore may optionally include a separate antenna for providing additional heat to the hydrocarbon resource 31, as set forth in U.S. Pat. Pub. No. 2013/0192825 to Parsche, which is assigned to the present Assignee Harris Corporation of Melbourne, Fla., and which is hereby incorporated herein in its entirety by reference.

A transmission line 38 extends within the wellbore 33 between the RF source 34 and the RF antenna 35, and a dipole driving gap 110 is configured between the RF antenna and the transmission line. The RF antenna 35 illustratively includes an inner conductor 36 and an outer tubular conductor 37, which advantageously defines a dipole antenna. A balum 111 may also be positioned in the wellbore adjacent the RF antenna 35. However, it will be appreciated that other antenna configurations may be used in different embodiments. A dielectric may separate the inner conductor 36 and the outer tubular conductor 37, and these conductors may be coaxial in some embodiments. However, it will be appreciated that other antenna configurations may be used in different embodiments. The outer tubular conductor 37 will typically be partially or completely exposed to radiate RF energy into the hydrocarbon resource 31, as will be appreciated by those skilled in the art.

The transmission line 38 may include a plurality of separate segments which are successively coupled together as the RF antenna is pushed or fed down the wellbore 33, as will be appreciated by those skilled in the art. The transmission line 38 may also include an inner conductor 39 and an outer tubular conductor 40, which may be separated by a dielectric material, for example. A dielectric may also surround the outer tubular conductor 40, if desired. In some configurations, the inner conductor 39 and the outer tubular conductor 40 may be coaxial, although other transmission line conductor configurations may also be used in different embodiments. Shielded type transmission lines 38 may be preferential to avoid unwanted heating between the surface and the hydrocarbon resource 31.

In a typical of Athabasca Oil Sand reservoirs embodiment, horizontal directional drilling (HDD) may be employed so the wellbore 33 may be a bent wellbore 33. The antenna may be a horizontal ½ wave dipole of 1 kilometer length operated near 0.13 MHz fundamental resonance. About 5 kilowatts of RF power may be applied per meter of antenna length, so the transmission line 38 preferably convey 5 megawatts of RF power. Relatively small transmission line diameter is important to minimize drilling costs. As may be appreciated then, transmission line efficiency is of the upmost importance. Transmission line diameter is preferably due to drilling costs. Voltage stand-in wave ratio (VSWR) must be low and a constant antenna resistance provided.

Lowest VSWR and best efficiency are obtained when antenna load resistance equals the transmission line characteristic impedance. Heating changes the electrical characteristic of the hydrocarbon resource 31, permittivity and conductivity, so the antenna resistance will change as the heating progresses. Additionally, the antenna preferably provides a load impedance that is nonreactive, e.g. a resonate and resistive only. Underground means are therefore needed to adjust antenna resistance. The antenna resistance may be adjusted to be near 30 ohms, as coaxial line characteristic impedance provides greatest coaxial transmission line power handling. Regarding the transmission line characteristic impedance, the text "Microwave Transmission Design Data", Theodore Moreno, ©1948, McGraw-Hill, is identified herein as a reference, especially FIG. 4-3, page 64, which indicates that 30 ohms provides greatest power handling, 77 ohms provide lowest dissipative loss, and 60 ohms greatest breakdown voltage.

So, transformer 45 may advantageously be positioned in the wellbore 33 which couples the RF antenna 35 to the RF source 34 via the transmission line 38 so that the RF antenna supplies RF power to the hydrocarbon resource 31 in the subterranean formation 32 at greatest efficiency. That is, the transformer 45 has an input 46 coupled to the transmission line 38, and an output 47 coupled to the RF antenna 37. The transformer 45 may advantageously provide desired gain adjustment (i.e., magnetic amplification by saturable reactor) or impedance matching (i.e., a transformer) to counteract changes in operating characteristics of the RF antenna 35 during the heating process. To this end, a feedback loop may optionally be included in some embodiments to determine the changing characteristics of the antenna 35, such as VSWR, such as set forth in U.S. Pat. Pub. No. 2014/0110104 to Parsche, which is assigned to the present Assignee Harris Corporation of Melbourne, Fla., and which is hereby incorporated herein in its entirety by reference. However, in other embodiments other devices such as temperature sensors, etc., may be used to determine how to appropriate control the transformer 45 to provide desired operating characteristics, as will be discussed further below.

Figure 2:
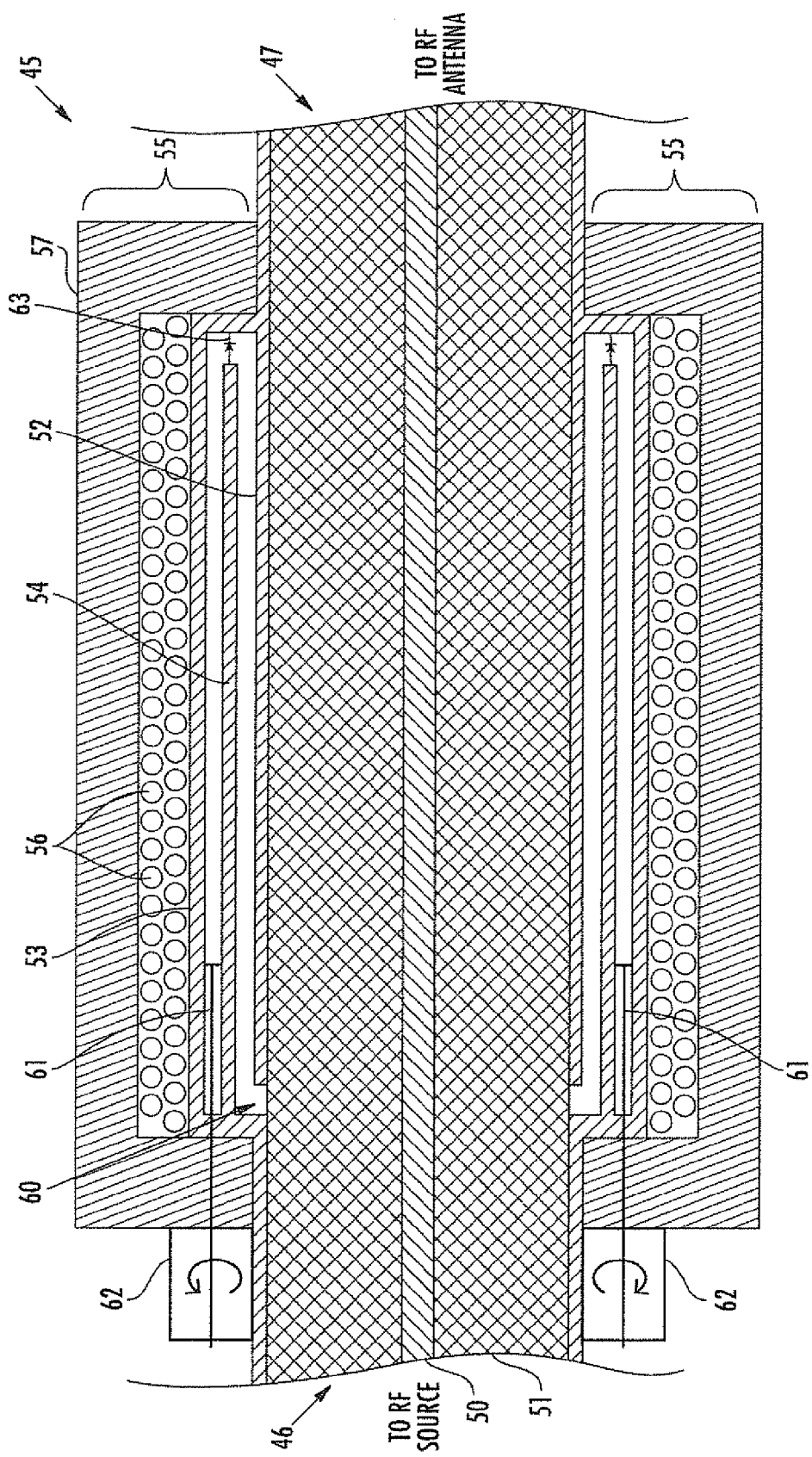
FIG. 2 is a cross-sectional view of a transformer for use with the system of FIG. 1.
Figure 3:
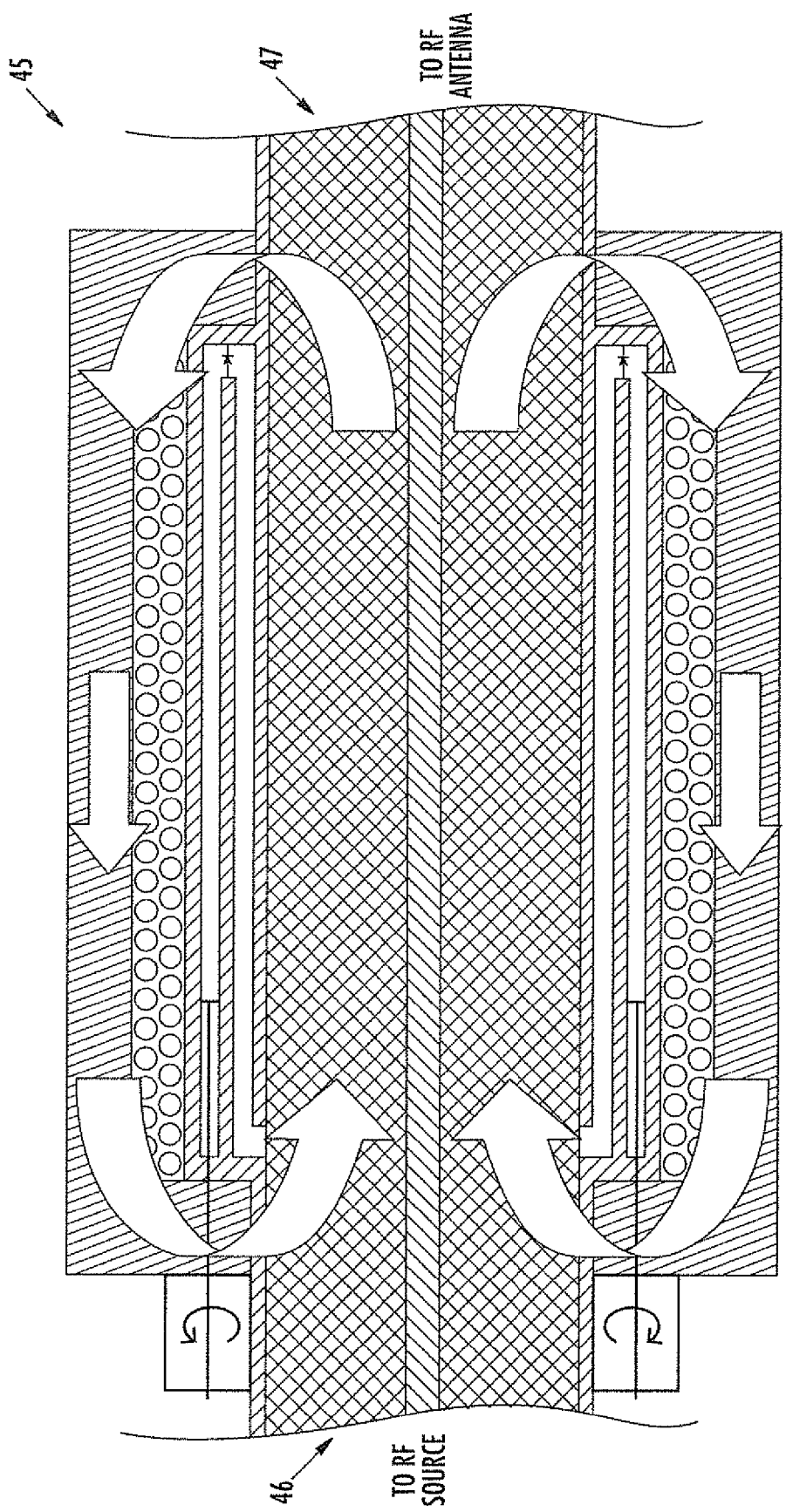
FIG. 3 is a cross-sectional view of the transformer of FIG. 2 in operation showing a DC magnetic field flow.

Referring more particularly to FIGS. 2 and 3, an exemplary embodiment of the transformer 45 is now described. The transformer 45 may conceptually be considered as a magnetic linear inductive transformer, a transmission line of variable characteristic impedance, or a saturable reactor impedance matching network which illustratively includes a core comprising an elongate inner conductor 50 and a magnetic medium 51 surrounding the elongate inner conductor. Furthermore, a shield assembly surrounds the core, and the shield assembly includes an inner concentric conductor 52 surrounding the magnetic medium 51, an outer concentric conductor 53 spaced apart from the inner concentric conductor, and a stub conductor 54 positioned between the inner concentric conductor and the outer concentric conductor. By way of example, the stub conductor may be formed as a concentric stub of transverse electromagnetic mode (TEM) transmission line that is folded to provide a lumped reactance, as will be appreciated by those skilled in the art. The shield assembly may be formed by positioning concentric conductive plates or tube sections in a spaced apart relation using dielectric spacers, for example. In the illustrated example, the shield assembly defines a circumferential gap 60 around the magnetic medium 51, although such a gap need not be included in all embodiments.

The elongate inner conductor 50 and the outer shield assembly accordingly define a coaxial conductor arrangement, but instead of providing a dielectric between the elongate inner conductor and the outer shield assembly, the magnetic medium 51 is instead provided. However, a coaxial arrangement need not be used in all embodiments. By way of example, the magnetic medium 51 may comprise a bulk nonconductive magnetic media, such as a ferrite, powdered iron, laminated silicon steel, stranded iron wire, etc. As background, magnetic fields act inside atoms and electric fields between atoms. So in the case of magnetic materials, magnetic atoms are needed. Most or all of the ferromagnetic atoms are also electrically conductive, like iron, cobalt, nickel etc. So, the magnetic medium 51 may incorporate microstructures, say insulated apart laminations, coated power grains, etc. To separate the magnetic atoms into isolated groups to form a magnetic medium 51 that is electrically nonconductive in bulk, which in turn reduces eddy current loss. Magnetic medium 51 may also be a mixture of magnetic and dielectric materials.

The transformer 45 further illustratively includes an electromagnet 55 surrounding the shield assembly. The electromagnet 55 illustratively includes a conductive winding 56 surrounding the shield assembly, and an electromagnetic core 57 surrounding the conductive winding. By way of example, the electromagnetic winding may comprise copper wire, and the electromagnetic core 57 may comprise silicon steel, although other suitable materials may also be used in different embodiments. Permanent magnets (not shown) may also be associated with electromagnet 55.

As will be discussed further below, a bias current (e.g., a DC bias current) may be applied to the winding 56 to advantageously cause a steady state/DC magnetic field to flow and in turn to vary the permeability of the magnetic medium 51 (which is represented by circulating arrows in FIG. 3) and thereby change resistance, reactance or both of the RF antenna 35. When the magnetic field is not steady state modulation or amplification may be provided. In some embodiments, optional tuning features may also be provided to assist with individually tuning resistance and reactance. One such tuning feature is a tuning plunger 61 associated with the shield assembly, which may be driven by a motor 62 along a length of the stub conductor 54 to selectively change an effective electrical length of the shield assembly. In the illustrated embodiment two tuning plungers 61 and associated motors 62 are provided, although different numbers of tuning plungers (or no tuning plungers) may be used in different embodiments. Another tuning feature that may optionally be included to change the effective electrical length of the shield assembly is one or more diodes 63 coupled to the stub conductor 54. Other suitable tuning features may also be used in different embodiments, as will be appreciated by those skilled in the art. For instance, the radio frequency of the RF power source may be adjusted at the surface to reduce reactance from the antenna, e.g., the transmitter can track antenna resonance, or the frequency can be adjusted to on side of antenna resonance to introduce opposite sign reactance to that of the unwanted reactance introduced by the transformer 45, to cancel reactance introduced by the transformer 45. In practice, when the frequency is changed, half wave dipole antenna reactance changes much more quickly than half wave dipole resistance. Changing frequency and transformer 45 DC current amplitude provide dual controls to adjust antenna resistance separately from antenna reactance. Additional information on frequency tracking is set forth in U.S. Pat. No. 8,726, 986 to Parsche, which is hereby incorporated herein in its entirety by reference In one example implementation, a length of the electromagnet 45 may be proportional to an operating wavelength of the RF signal (e.g., λ/4). Furthermore, the characteristic impedance of the coaxial structure of the transformer 45 will be proportional to a permeability μ of the magnetic medium 51, inside transformer 45 such that an characteristic impedance of the coaxial transmission line structure of the transformer 45 given by the formula:

$$Z_0 = \frac{1}{2\pi}\sqrt{\frac{\mu}{\varepsilon}},$$

where $\varepsilon$ is the relative permeability of the magnetic medium 51 and μ the relative permeability. The relative permittivity of nickel zinc ferrite magnetic media 51 may be between 11 to 14 and constant, e.g. the relative permittivity of a nickel zinc ferrite magnetic media 51 does not vary appreciably with the strength of the applied DC magnetic field. Only the relative magnetic permeability varies with the applied DC magnetic field. So, where the impedance at the output 47 is defined as $Z_1$, and the impedance at the input 47 is defined as $Z_2$, the impedance transformation for the transformer 45 is given by the following relationship (where the length of the transformer is λ/4):

$$Z_2 = \frac{(Z_0)^2}{Z_1} = \frac{\left(\frac{1}{2\pi}\sqrt{\frac{\mu}{\varepsilon}}\right)^2}{Z_1}.$$

The present invention may provide about a 5 to 1 change in resistance transformation ratio $Z_2/Z_1$, with a nickel zinc ferrite magnetic media 51, with sufficient change in the DC magnetic field. A laminated silicon steel magnetic media 51 (not shown) may provide a greater change.

Figure 4:
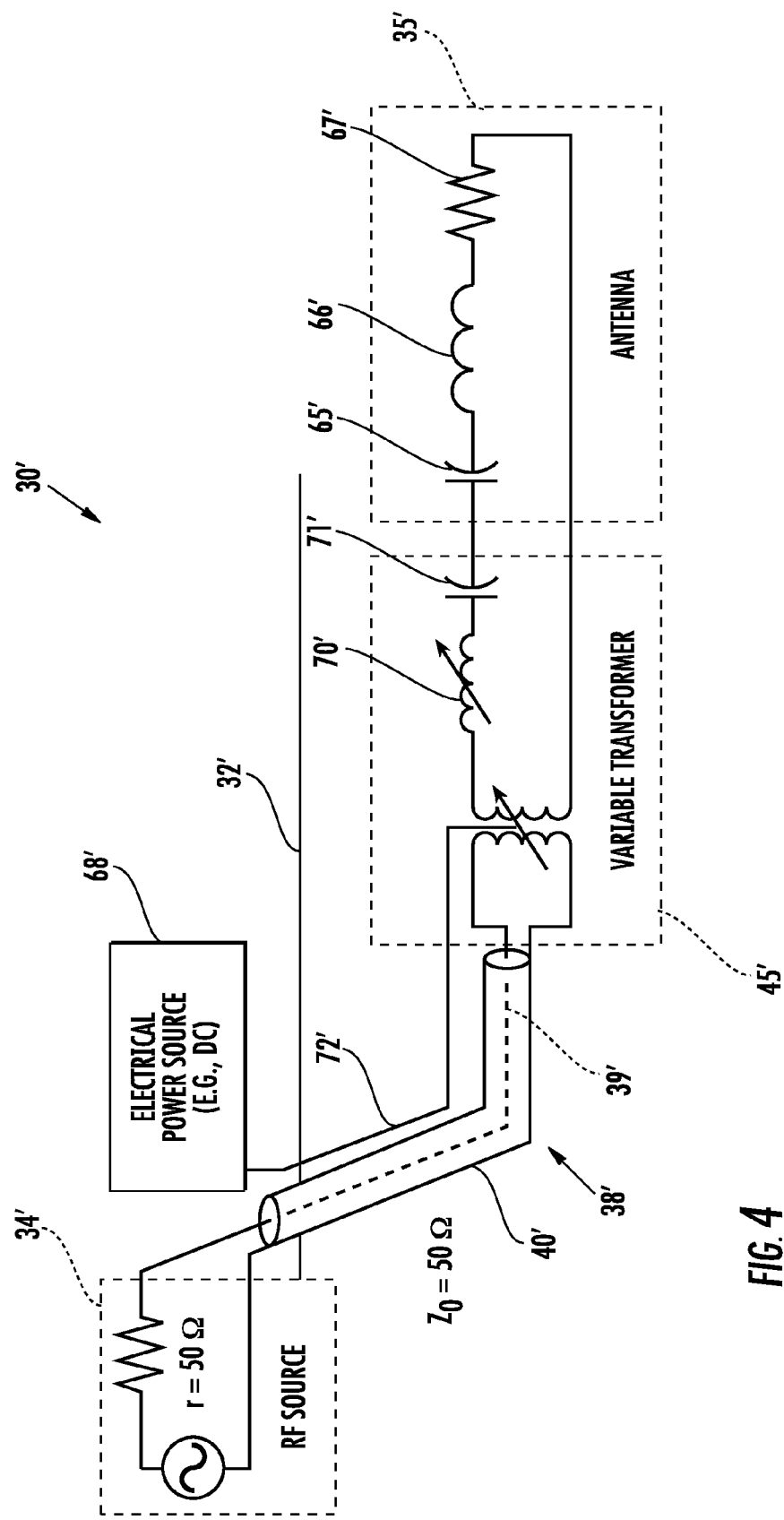
FIG. 4 is a schematic block diagram of an example implementation of the system of FIG. 1 in which the transformer is implemented as a variable transformer.

Referring additionally to FIG. 4, an exemplary embodiment in which the transformer 45' is configured as a variable transformer is now described. Here, the variable transformer advantageously provides impedance matching between the 50 Ohm transmission line 38' and the antenna 35', which will have an impedance that varies during the heating process. The antenna 35' is illustratively represented as a capacitor 65', an inductor 66', and a resistor 67' coupled in series in the schematic circuit diagram of FIG. 4. An electrical power source 68', such as a variable direct current (DC) power source, is coupled to the winding 56 of the electromagnet 55 to provide a bias current for controlling the variable transformer 45', which is illustratively represented by a control line 72' connected between the electrical power source 68' and a transformer switch 69'. Moreover, the DC bias voltage and above-noted tuning features may also be adjusted to fine tune reactance, as represented by a variable inductor 70' and capacitor 71' which are illustratively connected in series.

Figure 5:
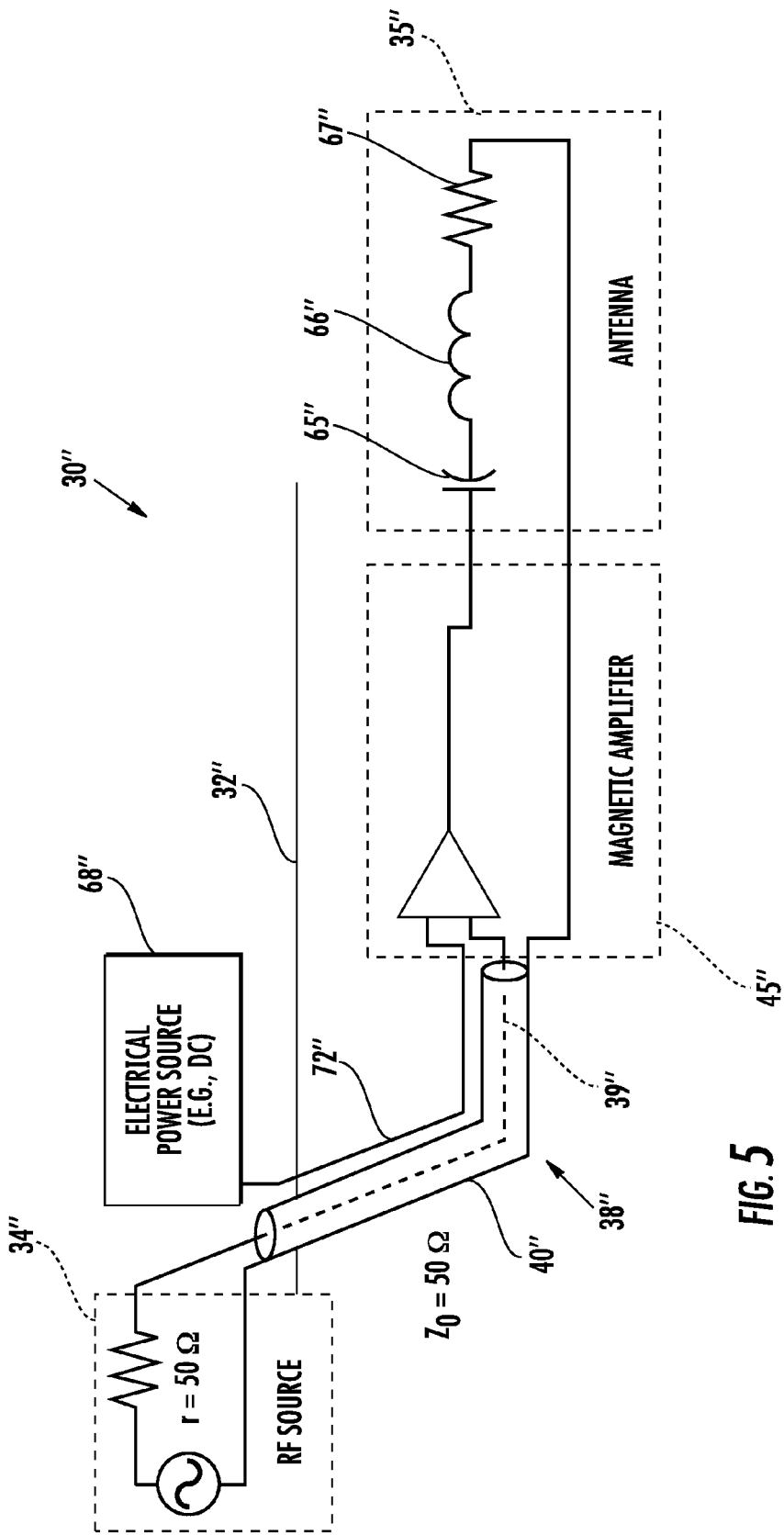
FIG. 5 is a schematic block diagram of an example implementation of the system of FIG. 1 including a magnetic amplifier.

Referring further to FIG. 5, an exemplary configuration in which the transformer 45" is configured as a magnetic amplifier is now described. Here again, a bias current (e.g., a DC bias current) is provided by the electrical power source 68" to change the signal amplification by the magnetic amplifier 45".

Generally speaking, the basic structure of the transformer 45 when configured as a variable transformer will be similar to that of a magnetic amplifier configuration. However, the operating principle of the magnetic amplifier is different than that of the variable transformer, in that the magnetic amplifier is essentially a saturable reactor. Configured as a magnetic amplifier, the transformer 45 makes use of magnetic saturation of the magnetic medium 51, a non-linear property of certain nonconductive magnetic materials such as those noted above. For controlled saturation characteristics, the magnetic amplifier employs core materials that provide a B-H curve shape that is highly rectangular, in contrast to the more slowly-tapering B-H curve of softly saturating core materials that are typically used in transformers, as will be appreciated by those skilled in the art.

Figure 6:
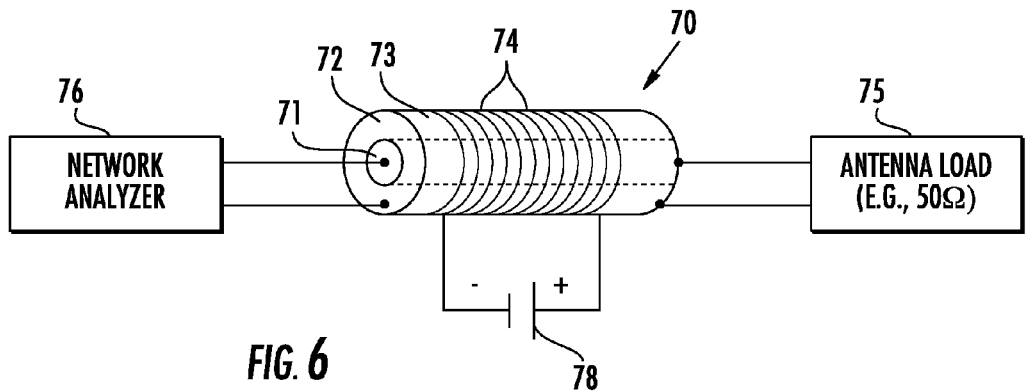
FIG. 6 is a schematic block diagram of an example test configuration of the transformer of FIG. 2.
Figure 7:
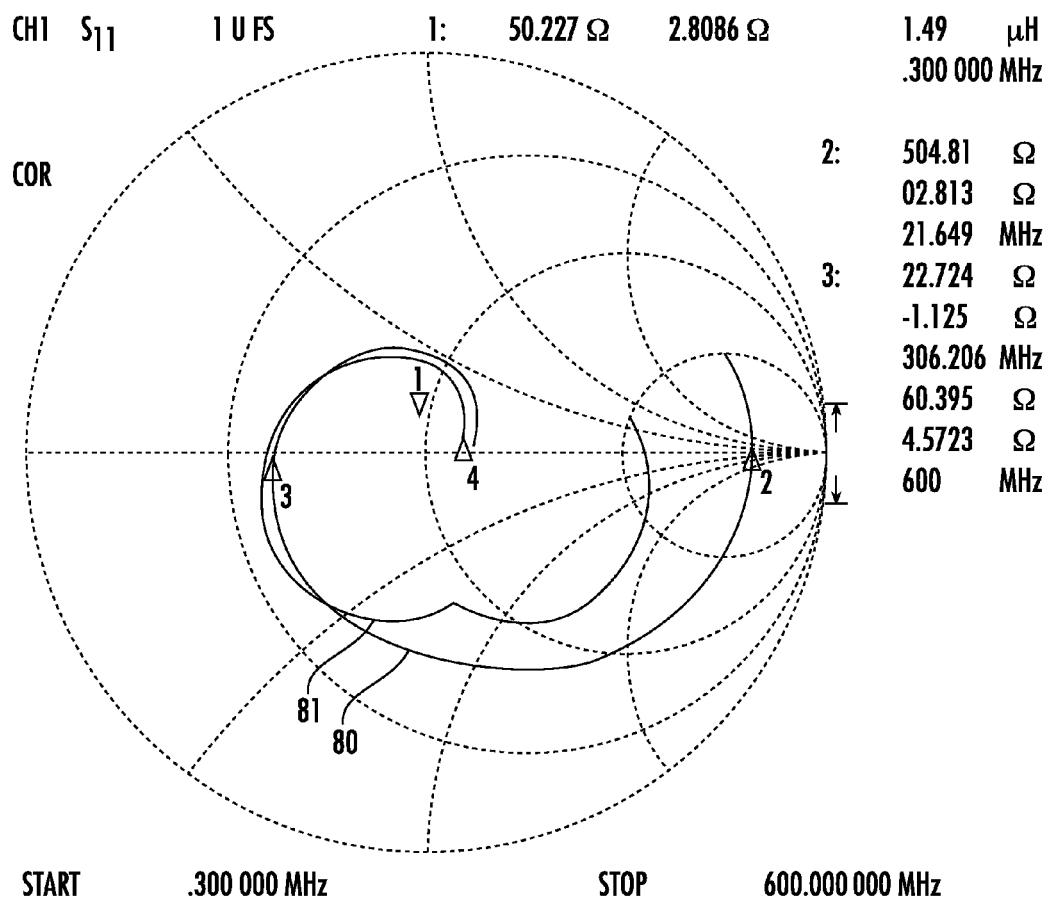
FIG. 7 is a Smith chart of measured impedances of the example test configuration of FIG. 6 with and without the application of a DC bias current to the transformer.
Figure 8:
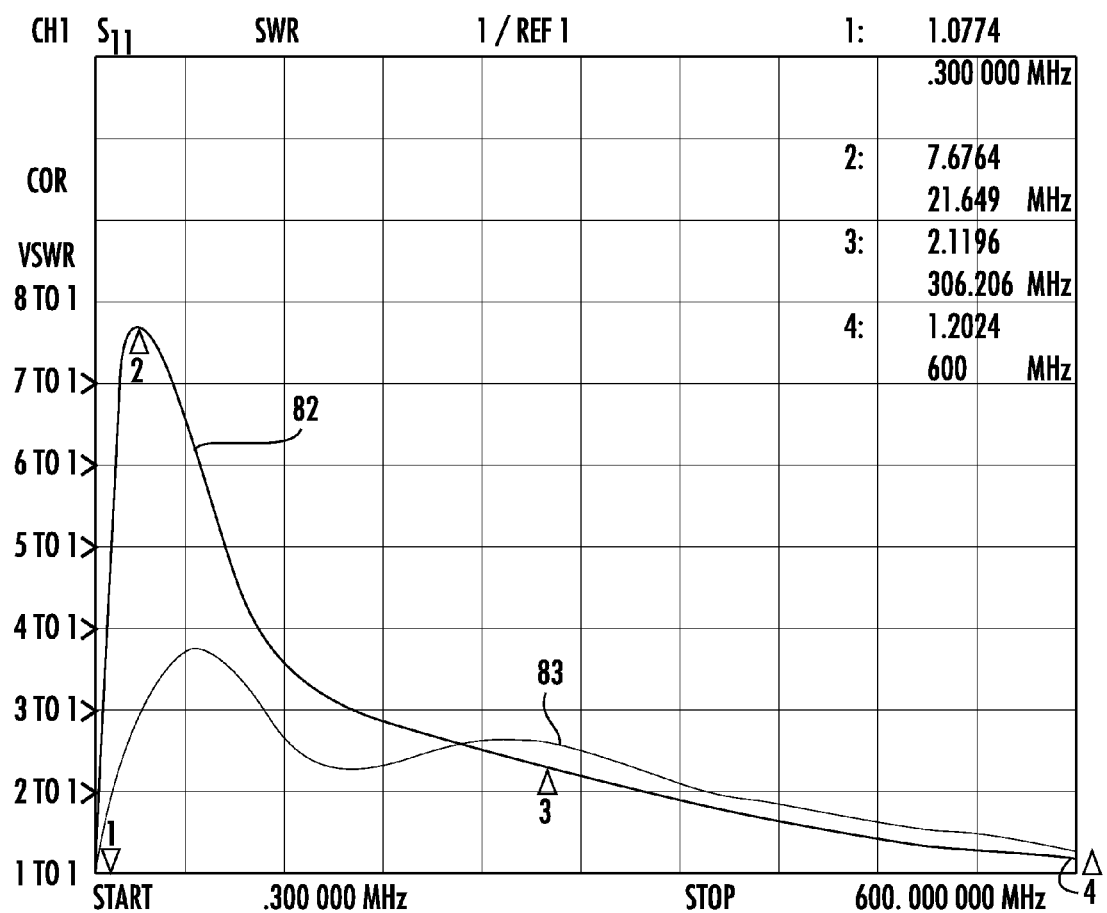
FIG. 8 is a graph of Voltage Standing Wave Ratio (VSWR) vs. frequency for the test configuration of FIG. 6 with and without a DC bias current applied to the transformer.

Turning to FIGS. 6-8, a scale model test implementation of a transformer 70, which is similar in structure to the transformer 45, and accompanying test results are now described. The transformer 70 included an elongate inner conductor 71, a magnetic medium 72 surrounding the elongate inner conductor comprising of twenty-one Fair-Rite Corporation part number FT-50-61 nickel zinc ferrite toroids, initial relative permeability 125, arranged side-by side, an outer concentric conductor 73 (a 0.550 inch copper tube) serving as the shield assembly, and a conductive winding 74 of 400 turns around the magnetic medium comprising 26 AWG wire. A transformer 70 length of the was 4.5 inches. The test transformer 70 was coupled to a simulated antenna load 75 (i.e., a 50 Ohm resistive only load) and a vector network analyzer 76 (an HP8453C in the test configuration), which provided the RF test signal and was used to take impedance and insertion loss measurements, and the conductive winding 74 was driven by a variable 0-2 Amp 6V DC supply 78.

For the test configuration, for a 21.6 MHz RF test signal the referred impedance without any magnetic bias was 504+2.8j Ohms. In other words, the Z=50+j) ohms load was transformed to Z=504+208j Ohms by the transformer. After applying a two ampere DC current to the conductive winding 74, the referred impedance became Z=102+55j Ohms. In other words, a 5-to-1 resistance change was measured, and thus a 5-to-1 variable ratio transformer was achieved. Some inductive reactance was introduced at maximum DC current flow, 55j−2.8j=52.2j ohms, and when uses with an antenna this reactance can be eliminated by adjusting RF power source frequency slightly off the antenna resonance, e.g. the antenna is capacitive to offset transformer inductance. The relative permeability of the magnetic medium 72 may have varied over a 25 to 1 range, e.g. $\mu_r$=125 without DC magnetic bias and $\mu_r$=5 with 800 ampere-turns of DC magnetic bias applied. It is thought that relative permittivity of the ferrite, which is about 12, was little changed by the magnetic bias. The 61 mix ferrite was magnetically soft and no remnant magnetism was noticed. The Smith chart of FIG. 7 includes a first trace 80 for the unsaturated (i.e., 0 ampere DC bias) case, and a second trace 81 for the saturated (i.e., 2 ampere DC bias) case. Corresponding graphs 82, 83 of VSWR vs. frequency for the unsaturated and saturated cases, respectively, as provided in FIG. 8. The scale model of the present invention was simple to construct and the invention is practical over a wide range of scales.

Figure 9:
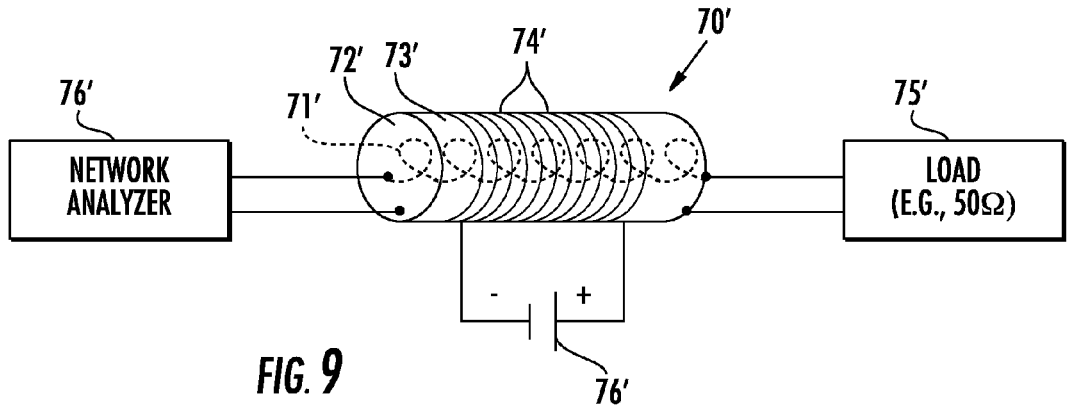
FIG. 9 is a schematic block diagram of an alternative embodiment of the test configuration of FIG. 6.

Another example test embodiment of the transformer 70' is shown in FIG. 9, which is similar to the transformer 70 discussed above with the exception that a helical inner conductor 71' was used rather than a straight, elongate inner conductor. The helical inner conductor 71' was found to provide increased resistance and reactance control, in addition to a series reactance. A Smith chart for the transformer 70' is provided in FIG. 10, which includes a first trace 90 showing the unsaturated (i.e., 0 ampere DC bias) case, and a second trace 91 for the saturated (i.e., 2 ampere DC bias). As will be appreciated by the skilled artisan, the results obtained in the above-noted test configurations are scalable to relatively high power (e.g., 2-10 megawatts) hydrocarbon resource recovery implementations. In typical implementations, the transmission line 38 and RF antenna are formed by a plurality of segments or pieces that are coupled together as the assembly is fed down the wellbore 33, as noted above. Such segments may typically be up to about forty feet in length and have diameters up to about twelve inches (e.g., a ten inch diameter), for example, and the transformer 45 may have similar dimensions depending upon the operating frequencies, etc., for example. Moreover, it should also be noted that in some implementations more than one transformer 45 may be used. In some implementations the entire transmission line 38 may be a transformer 45.

Figure 10:
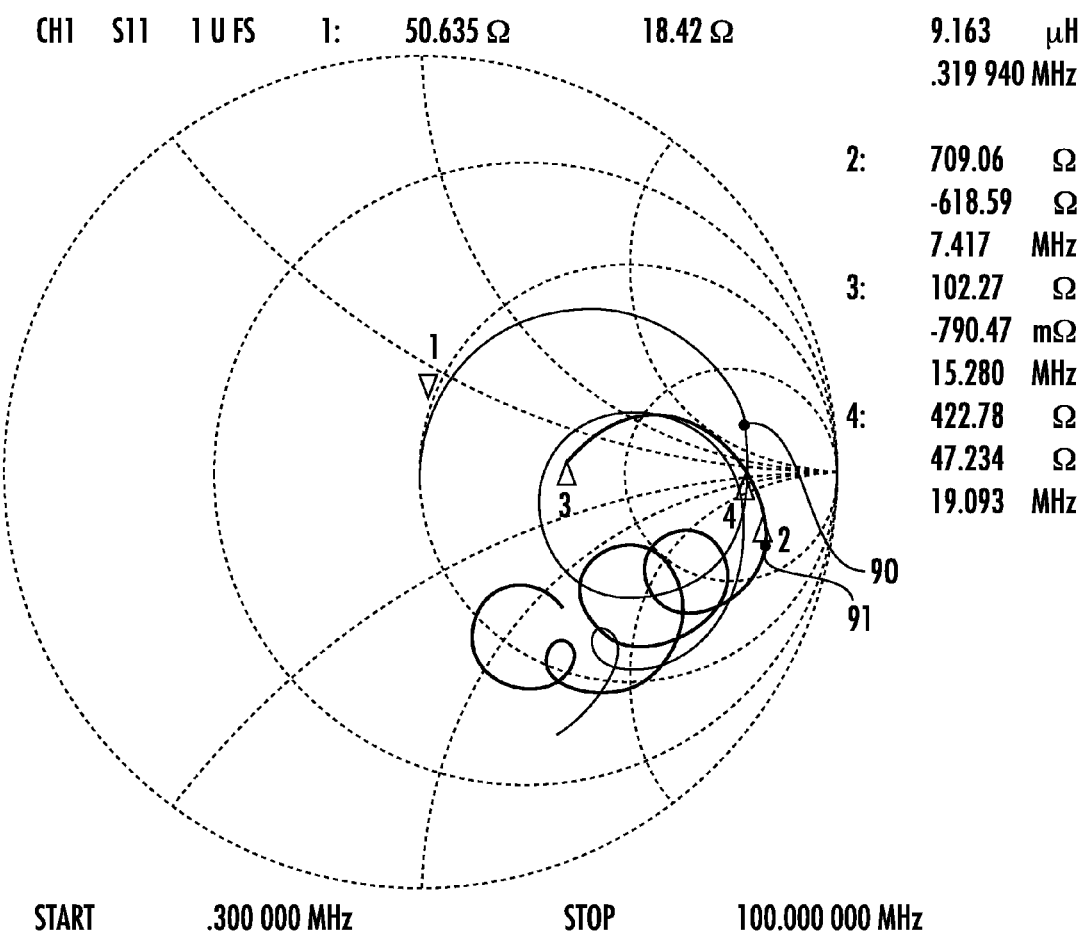
FIG. 10 is a Smith chart of measured impedances of the example test configuration of FIG. 9 with and without the application of a DC bias current to the transformer.
Figure 11:
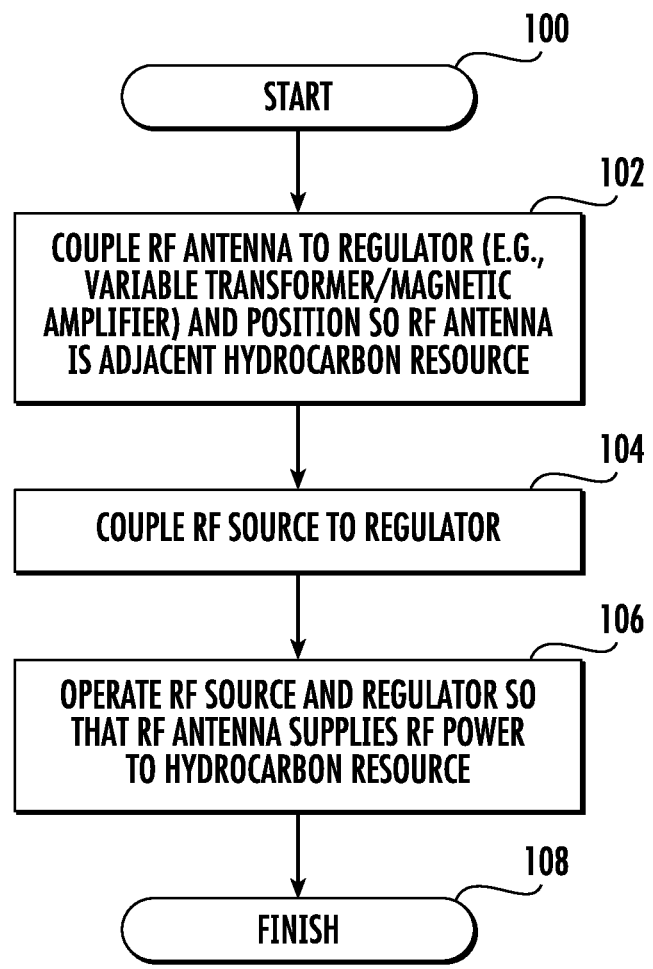
FIG. 11 is a flow diagram illustrating method aspects associated with the systems and devices of FIGS. 1-5.

A related method for heating a hydrocarbon resource 31 in a subterranean formation 32 is now described with reference to FIG. 10. Beginning at Block 100, the method illustratively includes coupling a transformer 45 (which may be configured as a transformer or a magnetic amplifier, as discussed above) to an RF antenna 35, and positioning the transformer and RF antenna within a wellbore 33 so that the RF antenna is adjacent the hydrocarbon resource 31, at Block 102. The method further includes coupling the transformer 45 to an RF source 34 (e.g., via a transmission line 38), at Block 104, and operating the RF source 34 and the transformer so that the RF antenna 35 supplies RF power to the hydrocarbon resource 31 in the subterranean formation 32, at Block 106, which illustratively concludes the method (Block 108). As noted above, the various components may be coupled together as separate segments which are fed down into the wellbore 33. Moreover, it should also be noted that in some embodiments the transformer 45 may be used above ground, such as when the hydrocarbon resource is dug up and placed in an above-ground recovery container, as will be appreciated by those skilled in the art.

Accordingly, it will be appreciated that the transformer 45 may be configured to advantageously provide a coaxially folded electromagnet that biases the magnetic media 51 inside a coaxial transmission line, to thereby provide a variable impedance matching transformer or magnetic amplifier, by varying the permeability of the magnetic media 51. Moreover, the coaxially-folded shield assembly advantageously provides loading reactance, as well as a magnetic "low pass filter", in that is allows the DC magnetic field from the electromagnet to flow into the magnetic medium, but at the same time prevents RF energy from escaping due to the skin effect of the shield assembly. Additionally, power factor (circulating current) from the antenna reactive load may advantageously be reflected back by the shielding assembly.

The electrical impedance of the RF antenna 35 will typically change as the hydrocarbon resource 31 heats because the electrical characteristics of the hydrocarbon resource 31 will change. For instance, the electrical conductivity of the hydrocarbon resource 31 will be reduced as connate water is turned to steam. The relative permittivity of the hydrocarbon resource 31 generally declines as well. There are two components to the impedance of the RF antenna 35, resistance and reactance. A method of the present invention is to control reactance of the RF antenna 35 by adjust the radio frequency of the RF source 34 while using the transformer 45 to adjust the resistance by of the RF antenna 35. This method provides the operative advantage of reducing circulating energy losses in the transformer 45 and the transmission line 38. It may be preferential to provide a resistance only load in the range of 30 to 70 ohms to a coaxial type transmission lines 38, although other values may be used.

The transformer 45 and the transmission line 38 may be one in the same in some embodiments. An entire coaxial transmission line from surface to antenna may contain a magnetic media 51 and have a conductive winding 56 on the outside.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A system for heating a hydrocarbon resource in a subterranean formation having a wellbore extending therein, the system comprising:
   a radio frequency (RF) source;
   a direct current (DC) source;
   an RF antenna to be positioned within the wellbore; and
   a magnetic amplifier to be positioned in the wellbore and configured to couple said RF source to said RF antenna with amplification based upon said DC source so that said RF antenna supplies RF power to the hydrocarbon resource in the subterranean formation;
   said magnetic amplifier comprising a core, a shield assembly surrounding said core, and an electromagnet surrounding said shield assembly.

2. The system of claim 1 wherein said core comprises an elongate inner conductor, and a magnetic medium surrounding said elongate inner conductor.

3. The system of claim 2 wherein said magnetic medium comprises a ferrite.

4. The system of claim 1 wherein said shield assembly comprises inner and outer concentric conductors, and a stub conductor therebetween.

5. The system of claim 1 further comprising at least one tuning plunger associated with said shield assembly.

6. The system of claim 1 wherein said electromagnet comprises a conductive winding surrounding said shield assembly, and an electromagnetic core surrounding said conductive winding.

7. The system of claim 1 wherein said inner conductor and said shield assembly are coaxial.

8. The system of claim 1 wherein said inner conductor comprises a helical conductor.

9. The system of claim 1 further comprising a transmission line coupled between said RF source and said magnetic amplifier.

10. A method for heating a hydrocarbon resource in a subterranean formation having a wellbore extending therein, the method comprising:
coupling a magnetic amplifier to a radio frequency (RF) antenna, and positioning the magnetic amplifier and RF antenna within the wellbore so that the RF antenna is adjacent the hydrocarbon resource, the magnetic amplifier comprising a core, a shield assembly surrounding the core, and an electromagnet surrounding the shield assembly;
coupling the magnetic amplifier to an RF source; and
operating the RF source and the magnetic amplifier so that the RF antenna supplies RF power to the hydrocarbon resource in the subterranean formation.

11. The method of claim 10 wherein operating further comprises applying a variable direct current (DC) current to the magnetic amplifier.

\* \* \* \* \*